United States Patent
Dutta

(10) Patent No.: US 11,804,491 B2
(45) Date of Patent: Oct. 31, 2023

(54) DEVICES WITH STAGGERED BODY CONTACTS

(71) Applicant: GLOBALFOUNDRIES U.S. Inc., Malta, NY (US)

(72) Inventor: Anupam Dutta, Kolkata (IN)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/872,812

(22) Filed: Jul. 25, 2022

(65) Prior Publication Data

US 2022/0359572 A1     Nov. 10, 2022

Related U.S. Application Data

(63) Continuation of application No. 16/987,170, filed on Aug. 6, 2020, now Pat. No. 11,476,279.

(51) Int. Cl.
*H01L 27/12* (2006.01)
*H01L 29/417* (2006.01)
*H01L 29/423* (2006.01)

(52) U.S. Cl.
CPC .... *H01L 27/1203* (2013.01); *H01L 29/41733* (2013.01); *H01L 29/42384* (2013.01)

(58) Field of Classification Search
None
See application file for complete search history.

(56) References Cited

U.S. PATENT DOCUMENTS

| 5,109,256 A | 4/1992 | De Long |
| H1435 H | 5/1995 | Cherne |
| 5,594,371 A * | 1/1997 | Douseki ........... H01L 27/12 |
| | | 326/122 |
| 5,930,605 A | 7/1999 | Mistry et al. |
| 6,215,138 B1 | 4/2001 | Takao |
| 6,275,059 B1 | 8/2001 | Sah |
| 6,316,808 B1 | 11/2001 | Smith, III |
| 6,677,645 B2 | 1/2004 | Bryant et al. |
| 6,861,716 B1 | 3/2005 | Hyde |
| 7,863,171 B2 | 1/2011 | Hoentschel et al. |

(Continued)

FOREIGN PATENT DOCUMENTS

EP     1243028     9/2002

OTHER PUBLICATIONS

Mutschler, Ann, "The Return of Body Biasing", https://semiengineering.com/the-return-of-body-biasing/, Nov. 15, 2017 (Year: 2017).*

Karthik et al., "Variable body biasing technique to reduce leakage current in 4x4 DRAM in VLSI", IJIRSET, vol. 6, issue 5, May 2017 (Year: 2017).*

(Continued)

*Primary Examiner* — Vincent Wall
(74) *Attorney, Agent, or Firm* — Anthony Canale; Andrew M. Calderon; Calderon Safran & Cole P.C.

(57) ABSTRACT

The present disclosure relates to semiconductor structures and, more particularly, to devices with staggered body contacts and methods of manufacture. The device includes: a gate structure on a semiconductor substrate material, the gate structure comprising a gate body with a width and a length; a plurality of body contacts electrically contacting a channel region under the gate body on at least one side of the gate body along its width; and isolation structures isolating the plurality of body contacts from a source region and a drain region associated with the gate structure.

20 Claims, 13 Drawing Sheets

(56) References Cited

U.S. PATENT DOCUMENTS

| | | |
|---|---|---|
| 8,013,337 B2 | 9/2011 | Choi |
| 8,432,016 B1 | 4/2013 | Kerr |
| 9,780,117 B2 | 10/2017 | Nygaard et al. |
| 9,818,652 B1 | 11/2017 | Pei et al. |
| 2002/0115244 A1 | 8/2002 | Park et al. |
| 2003/0222308 A1 | 12/2003 | Su et al. |
| 2009/0243725 A1 | 10/2009 | Abe |
| 2009/0315080 A1* | 12/2009 | Stribley .............. H01L 27/0921 257/E27.06 |
| 2010/0252884 A1 | 10/2010 | Kitano |
| 2011/0031535 A1 | 2/2011 | Iwamatsu |
| 2012/0205744 A1 | 8/2012 | O et al. |
| 2017/0141134 A1 | 5/2017 | Willard |
| 2017/0338251 A1 | 11/2017 | Willard |
| 2018/0166566 A1 | 6/2018 | Ellis-Monaghan |

OTHER PUBLICATIONS

Aggarwal et al., "A comparative study of various current mirror configurations: Topologies and characteristics", Microelectronics Journal 53 (2016) 134-155. (Year: 2016).*

Wikipedia, "File:MOSFET functioning body.svg", Aug. 5, 2008 (Year: 2008).* https://semiengineering.com/rf-soi-wars-begin/, May 17, 2018 (Year: 2018).*

Jiexin Luo et al., "A Tunnel Diode Body Contact Structure for High-Performance SOI MOSFETs", IEEE Transactions on Electron Devices, vol. 59, No. 1, Jan. 2012, 7 pages.

M. Narayanan et al., "Analysis of Kink Reduction in SOI MOSFET Using Selective Back Oxide Structure", Active and Passive Electronic Components vol. 2012, Article ID 565827, May 2012, 10 pages.

* cited by examiner

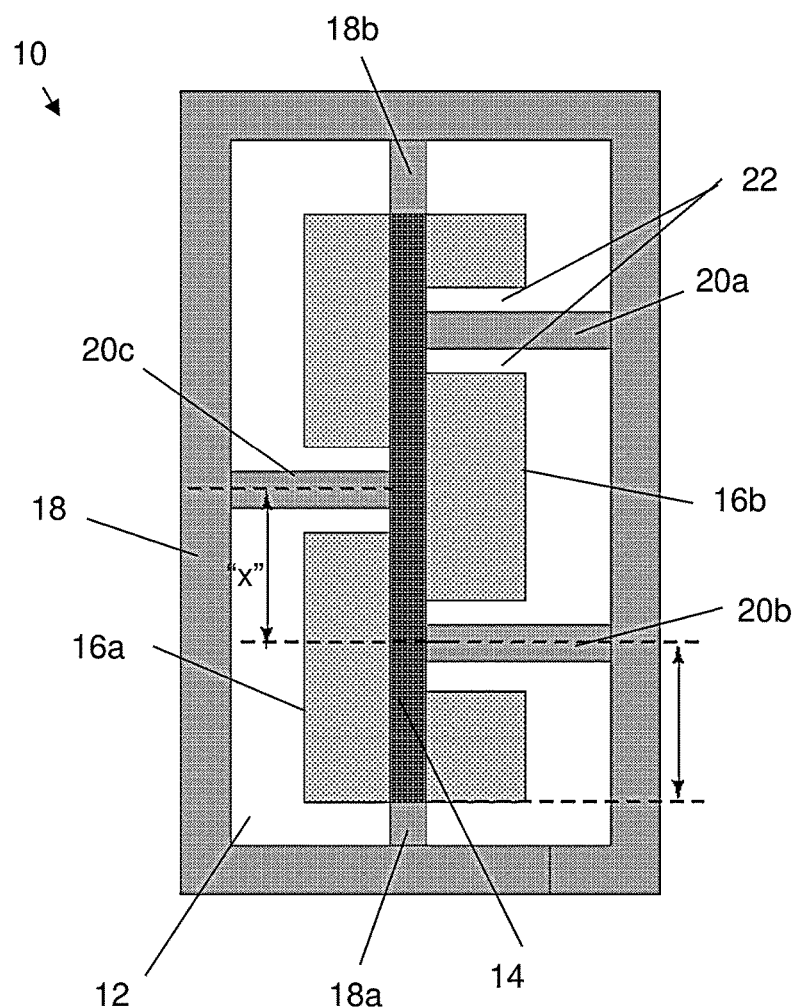
FIG. 1
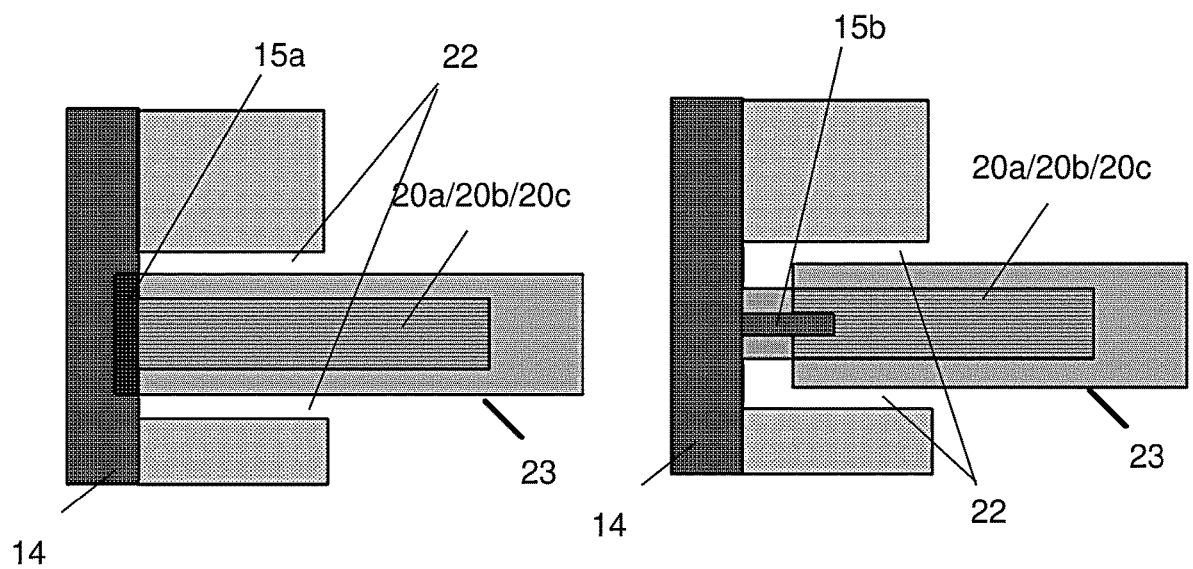
FIG. 2A
FIG. 2B

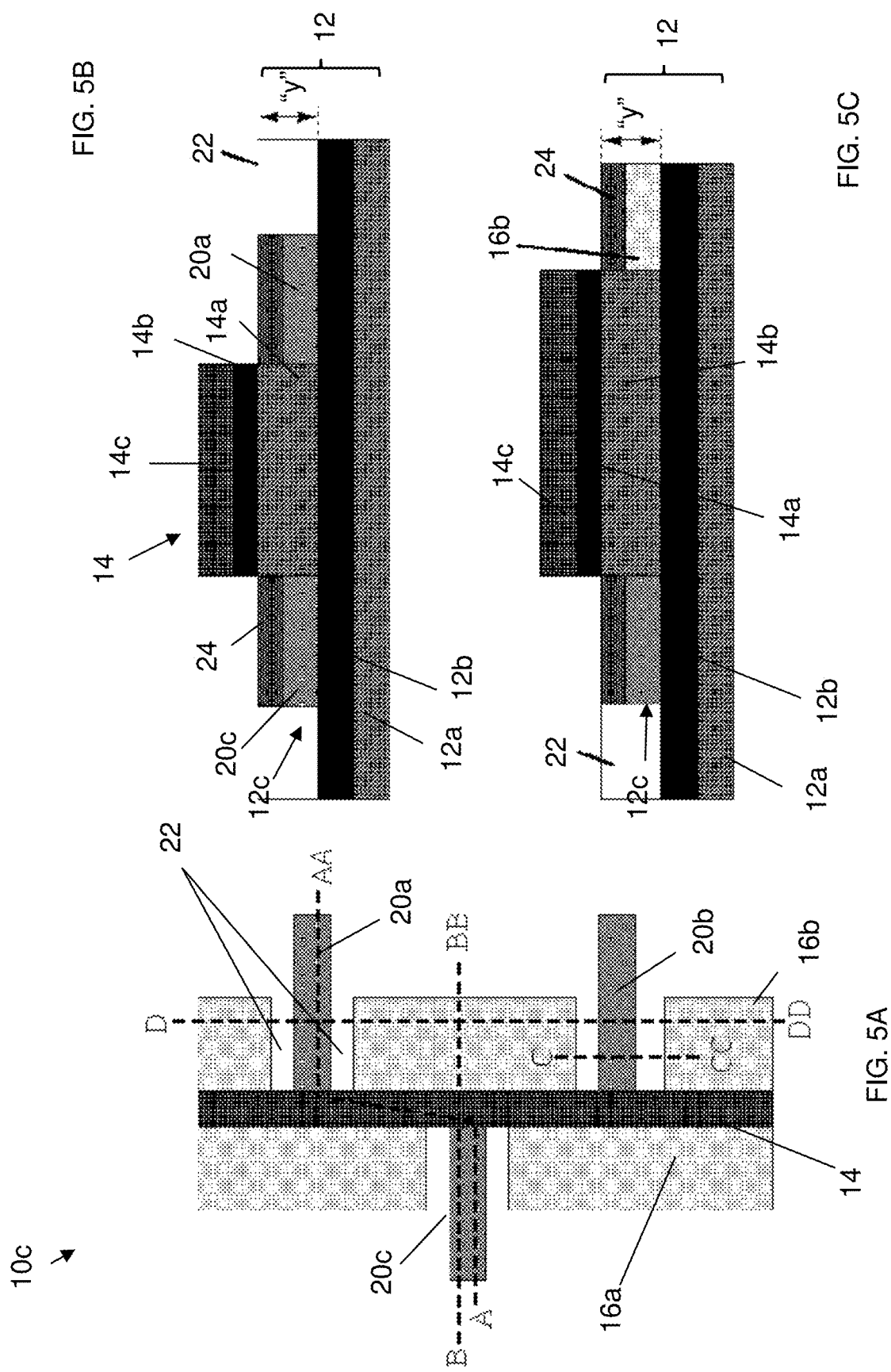

US 11,804,491 B2

DEVICES WITH STAGGERED BODY CONTACTS

FIELD OF THE INVENTION

The present disclosure relates to semiconductor structures and, more particularly, to devices with staggered body contacts and methods of manufacture.

BACKGROUND

Due to finite thickness of the epi-silicon layer on the oxide layer in semiconductor-on-insulator (SOI) technologies, body resistance varies with the applied terminal voltages and with the distance, itself. As should be understood, body resistance is the equivalent impedance seen at the body contact terminal from any given distance (d) along the width of the device, e.g., gate structure. Due to bias dependent variable body resistance, impact ionization generated holes keep accumulating along the width of the device. This phenomena induces floating body effects (typically seen in floating body device) in body contacted devices of different configurations, e.g., T-gate device, H-body device, H-gate device, L-gate device, and floating body device. The floating body effects (FBE) in body contacted devices can be seen as "kinks" in Ids-Vd or Gds-Vd plots. FBE in body contacted devices adversely affects the device linearity and breakdown voltage.

The Ids-Vd kink can be reduced by reducing well doping to increase diode saturation current. This makes the device more fully depleted, thus reducing built-in potential of the surface barrier (SB) junction. But doping reduction increases Ioff. On the other hand, increasing well doping to very high levels to make a perfect conductor at any high Vd may be technically impossible, as the Vth will increase very high and the device may not turn on. In addition, introducing pre-amorphization implants into the body region will eliminate generated minority carriers, and may even reduce the kink; but not for all Vg regimes.

SUMMARY

In an aspect of the disclosure, the structure comprises: a gate structure on a semiconductor substrate material, the gate structure comprising a gate body with a width and a length; a plurality of body contacts electrically contacting a channel region under the gate body on at least one side of the gate body along its width; and isolation structures isolating the plurality of body contacts from a source region and a drain region associated with the gate structure.

In an aspect of the disclosure, the structure comprises: a semiconductor on insulator substrate; an insulator layer underlying the semiconductor on insulator substrate; at least one gate structure on the semiconductor on insulator substrate; a source region and a drain region on opposing sides of the at least one gate structure, the source region and the drain region extending to the insulator layer; a plurality of body contacts electrically contacting the at least one gate body on at least one side along its width; and isolation structures extending to the insulator layer and isolating the plurality of body contacts from the source region, the drain region and from each other.

In an aspect of the disclosure, a structure comprises: at least one gate structure on a semiconductor substrate material; an insulator layer directly underneath the semiconductor substrate material; a source region on a first side of the at least one gate structure; a drain region on a second side of the at least one gate structure; a plurality of staggered body contacts which are offset from one another and which are provided along a width of the at least one gate structure on both the first side and the second side, respectively; and isolation structures extending to the insulator layer and which isolates the staggered body contacts from the source region the drain region and each of the plurality of staggered body contacts.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 1 shows a top view of a device with staggered body contacts, amongst other features, and respective fabrication processes in accordance with aspects of the present disclosure.

FIGS. 2A and 2B show enlarged views of different configurations of the staggered body contacts connecting to a gate structure, amongst other features, and respective fabrication processes in accordance with aspects of the present disclosure.

FIG. 5A is a top view of a symmetrical device with staggered body contacts, amongst other features, in accordance with yet another aspect of the disclosure.

FIG. 5B is a cross-sectional view of FIG. 5A, along line A-AA.

FIG. 5C is a cross-sectional view of FIG. 5A, along line B-BB.

DETAILED DESCRIPTION

Figure 4:
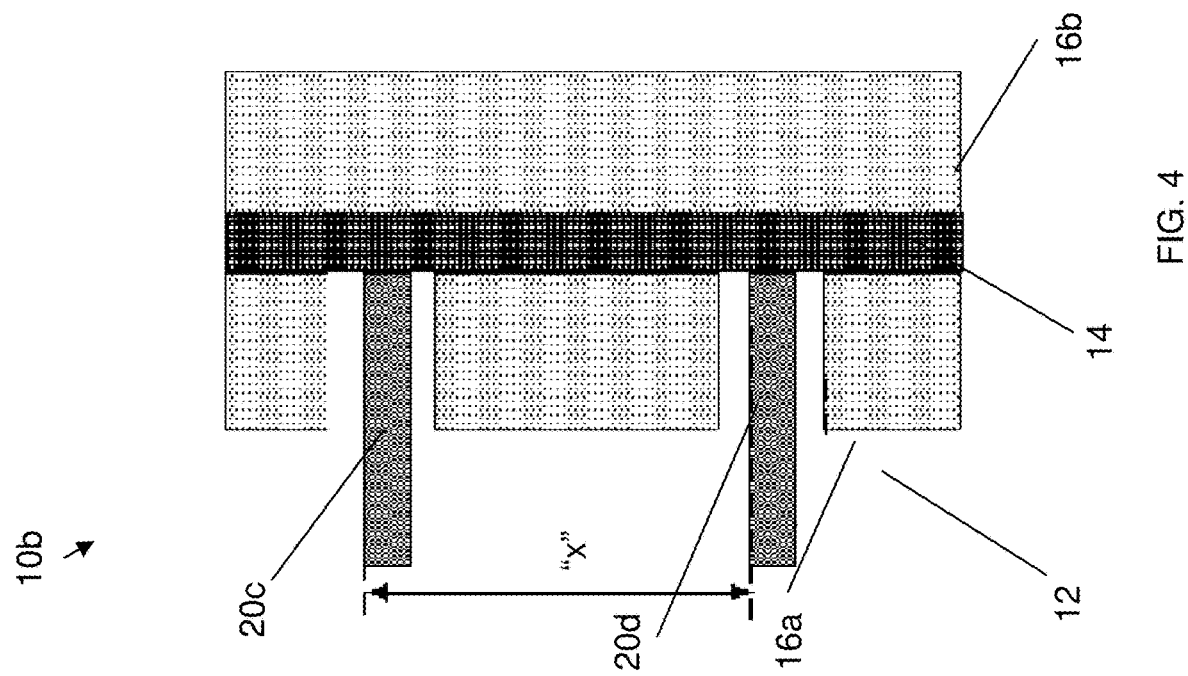
FIG. 4 shows a top view of an asymmetrical device with body contacts, amongst other features, and respective fabrication processes in accordance with additional aspects of the present disclosure.

The present disclosure relates to semiconductor structures and, more particularly, to devices with staggered body contacts and methods of manufacture. More specifically, the present disclosure is directed to field effect transistors (FETs) formed on a semiconductor-on-insulator (SOI) substrate with a plurality of body contacts in a staggered layout/arrangement along a width of the device. In embodiments, shallow trench isolation structures are located adjacent to the staggered body contacts to isolate the staggered body contacts. By way of example, a SOI body contact MOSFET includes staggered body contacts comprising one or more $P^+$ islands sandwiched between shallow trench isolation structures that extend to and contact the underlying insulator layer (e.g., buried oxide layer) to optimize device performance.

Advantageously, the use of the body contacts along a width of the device, e.g., gate structure, can be biased independently and also optimizes device performance, e.g., RF performance. For example, by implementing the staggered body contacts along a width of the device, irrespective of any process limitations, it is now possible to achieve improved linearity and breakdown voltage (BV). More specifically, in embodiments, the use of the staggered body contact arrangement will remove Id-Vd kink (Floating Body Effect) and increase breakdown voltage in a body contacted SOI MOSFET. Moreover, by implementing the staggered body contacts it is possible to attain maximum RF performance matrices (e.g., cutoff frequency (Ft), self-gain). In addition, for a non-symmetric configuration (LNA/PA) application there is no area penalty. And, in a separate body switch configuration, the individual device may have a higher area, but due to increase in BV, the stacked switch area will still be reduced compared to conventional layouts.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

FIG. 1 shows a top view of a device with staggered body contacts, amongst other features, and respective fabrication processes in accordance with aspects of the present disclosure. More specifically, the device 10 of FIG. 1 includes a substrate 12 comprising SOI technologies, or, alternatively, a bulk substrate wafer. In the SOI technology, for example, the substrate 12 includes an insulator layer on top of a semiconductor wafer and a semiconductor layer on top of the insulator layer. An exemplary insulator layer is a buried oxide layer (BOX); although other materials are also contemplated herein, e.g., sapphire, $SiO_2$, etc. The semiconductor layer and the semiconductor wafer (or, alternatively, bulk substrate wafer) may be any suitable semiconductor material including, but not limited to, Si, SiGe, SiGeC, SiC, GaAs, InAs, InP, and other III/V or II/VI compound semiconductors. The semiconductor layer and insulator layer can be formed by any suitable processes known to those of skill in the art such that no further explanation is required herein for a complete understanding of the disclosure.

Still referring to FIG. 1, a gate structure 14 is formed on the substrate 12 with source/drain regions 16a, 16b along a width thereof. In embodiments, the gate structure 14 can either be a nMOSFET or a pMOSFET using the different materials and dopant types as noted in the below TABLE.

TABLE

| Parameter | | nMOSFET | pMOSFET |
|---|---|---|---|
| Source/drain type | | n-type | p-type |
| Channel type (MOS capacitor) | | p-type | n-type |
| Gate type | Polysilicon | n+ | p+ |
| | Metal | ($\varphi_m$~Si conduction band) | ($\varphi_m$~Si valence band) |
| Well type | | p-type | n-type |
| Substrate type | | p-type | n-type |
| Gate Dielectric Material | | High-k or Low -k gate dielectric material | High-k or Low -k gate dielectric material |

In the present implementation, for example, the gate structure 14 is representative of a nMOSFET, with the source region 16a and the drain region 16b being n+ doped regions fabricated using known dopants and ion implantation processes, e.g., n-type dopants including Arsenic (As), Phosphorus (P) and Antimony (Sb), among other suitable examples. Accordingly, the gate body of the gate structure 14 is a n+ type material, e.g., n+ poly material, formed on a p-type substrate 12. The gate dielectric material can be a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

In embodiments, the gate structure 14 can be formed using a gate first process or a gate last process. In the gate first process, for example, the gate dielectric material and the gate body material are deposited on the substrate 12 using conventional deposition methods such as, e.g., chemical vapor deposition (CVD), physical vapor deposition (PVD) including sputtering, atomic layer deposition (ALD) or other suitable method. Following the deposition process, the materials are patterned using conventional lithography and etching (reactive ion etching (RIE)) processes known to those of skill in the art such that no further explanation is required for a complete understanding of the present disclosure. Sidewall spacers, e.g., nitride material, can be formed on sidewalls of the gate structure 14 by a conventional deposition process, followed by an anisotropic etching process known to those of ordinary skill in the art.

Still referring to FIG. 1, a body ring contact 18 surrounds the gate structure 14 and source and drain regions 16a, 16b. In embodiments, the body contact 18 is a ring contact fabricated using p+ dopants for an nMOSFET (or, alternatively, n+ dopants for a pMOSFET). The body ring contact 18 is electrically connected to each end of the gate structure 14 by contact bridges (e.g., extending tabs) 18a, 18b. In addition, the body ring contact 18 is electrically connected to the gate structure 14 along its width by staggered body contacts 20a, 20b and 20c. In embodiments, the contacts 18a, 18b, 20a, 20b, 20c are of a same dopant type as the contact 18, e.g., P+ dopants for an nMOSFET or, alternatively, N+ dopants for a pMOSFET. Also, the end contacts 18a, 18b, electrically connect the channel region 14a in the gate structure 14, similar to the staggered body contacts 20a, 20b, 20c, 20d.

The body contacts 20a, 20b are provided on a drain side of the gate structure 14; whereas, the body contact 20c is provided on a source side of the gate structure 14. As in each of the embodiments, the body contacts can be biased independently and will connect to the gate channel region under the gate structure 14. Also, although three staggered body contacts are shown in FIG. 1, it should be understood that as in each of the embodiments, multiple (e.g., two (2) or more) body contacts are provided along the width of the gate structure on one or both sides thereof, depending on the width of the gate structure 14 and the minimum ground rules available for a particular technology node. For example, as in each of the embodiments described herein, the body contacts 20a, 20b are staggered or offset (e.g., not aligned) from the contact 20c by a distance "x", e.g., 2*body contact (bc) pitch. In an illustrative non-limiting example, the distance "x" can be 2 microns; although other distances are contemplated as described below.

The contacts 18, 18a, 18b, 20a, 20b, 20c and source/drain regions 16a, 16b are formed by conventional ion implantation processes (and preferably extend to the underlying insulator layer in SOI technologies). For example, the source/drain regions 16a, 16b and contacts 18, 18a, 18b, 20a, 20b, 20c are formed by introducing a concentration of a different dopant of opposite conductivity type in the substrate 12 using respective patterned implantation masks to define selected areas exposed for the implantations. Well implants can be formed in the same manner. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

FIG. 1 further shows shallow trench isolation structures 22 that extend to the underlying insulator layer of the substrate 12 and which isolate the body contacts 20a, 20b, 20c from each other and the source/drain regions 16a, 16b. In this way, the body contacts 20a, 20b and 20c are p+ islands sandwiched between the shallow trench isolation structures 22 which extend and electrically connect to the gate channel region. The shallow trench isolation structures 22 can be formed by conventional lithography, etching and deposition methods known to those of skill in the art.

By way of illustration to form the shallow trench isolation structures 22, a resist formed over the substrate 12 is exposed to energy (light) to form a pattern (opening). An etching process with a selective chemistry, e.g., reactive ion etching (RIE), will be used to form one or more trenches in the substrate 12 through the openings of the resist. Following the resist removal by a conventional oxygen ashing process or other known stripants, the conductive material can be deposited by any conventional deposition processes, e.g., CVD processes. Any residual material on the surface of the substrate 12 can be removed by conventional chemical mechanical polishing (CMP) processes.

FIGS. 2A and 2B show enlarged views of different contact configurations of the staggered body contacts 20a, 20b, 20c connecting to the gate channel region under the gate structure 14. These contact connections can be used for any of the different aspects described herein. More specifically, in FIG. 2A, the staggered body contacts 20a/20b/20c extend to underneath the gate structure 14 to contact the gate channel region, forming a slight overlapped region 15a. The embodiment shown in FIG. 2A can be used to offset an etch bias of the gate structure 14 and the P+ mask 23. In contrast, in FIG. 2B, the gate structure 14 includes a notch or tab portion 15b which extends laterally outward from a side of the gate structure 14. In this implementation, the staggered body contacts 20a/20b/20c will make contact with the gate channel region through the region under the gate body tab and P+ mask 23 will overlap the notch portion 15b. As should be understood by those of skill in the art, the notch portion 15b is composed of the same material as the gate structure 14, e.g., poly material, and can be formed in the same deposition, patterning and etching processes.

Figure 3:
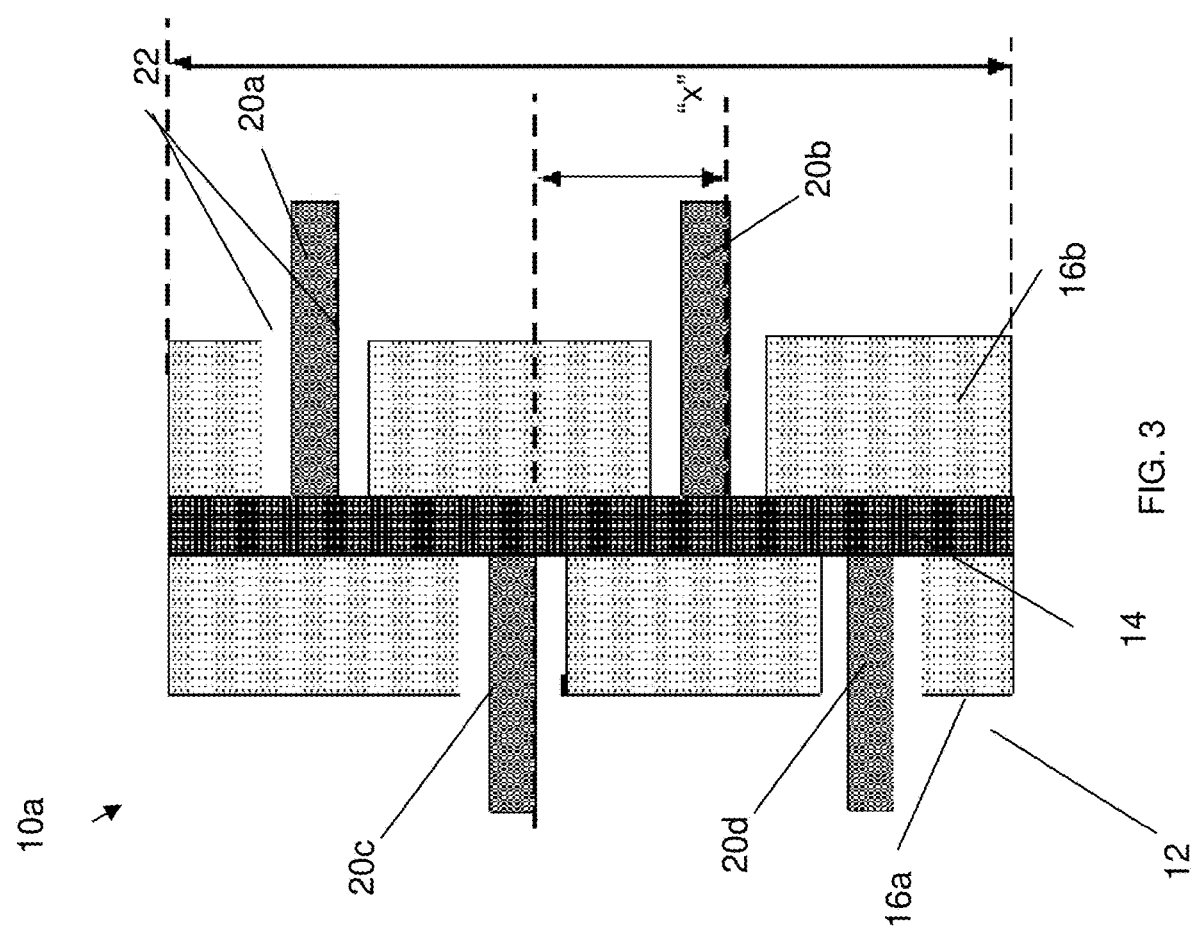
FIG. 3 shows a top view of a symmetrical device with body contacts, amongst other features, and respective fabrication processes in accordance with additional aspects of the present disclosure.

FIG. 3 shows a top view of a symmetrical device with body contacts, amongst other features. More specifically, the device 10a of FIG. 3 is a symmetrical device which can be used as an RF switch. In embodiments, the device 10a includes an equal number of staggered body contacts 20a-20d on each side of the gate structure 14 along its width. In this embodiment, the body contacts 20a-20d are isolated from their respective source and drain regions 16a, 16b by the shallow trench isolation structures 22. Also, the body contacts 20a, 20b are staggered or offset from the respective body contacts 20c, 20d by distance "x". Although two (2) contacts are shown on each side of the gate structure 14, it should be understood that more than two (2) contacts can be provided while maintaining a preferred spacing of "x", e.g., 2*body contact (bc) pitch.

FIG. 4 shows a top view of an asymmetrical device with staggered body contacts, amongst other features. More specifically, the device 10b of FIG. 4 includes an asymmetrical configuration with an unequal number of body contacts 20c, 20d along a width of the gate structure 14. In this embodiment, the body contacts 20c, 20d are provided on the source side of the gate structure 14 and no contacts are provided on the drain side of the gate structure 14. Alternative, additional body contacts can be provided on the drain side of the gate structure 14. For example, two (2) or more body contacts can be provided on a single side or any combination of unequal number of body contacts can be provided on different sides of the gate structure 14, while maintaining a preferred spacing and/or offset of "x", e.g., 2*body contact (bc) pitch. Also, the body contacts 20c, 20d are isolated from the source region 16a (or drain region 16 or both) by the shallow trench isolation structures 22.

Figure 5D:
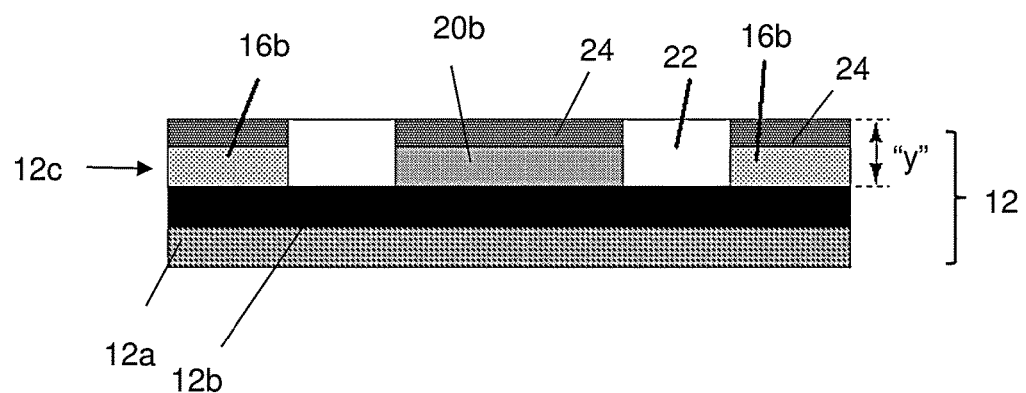
FIG. 5D is a cross-sectional view of FIG. 5A, along line C-CC.
Figure 5E:
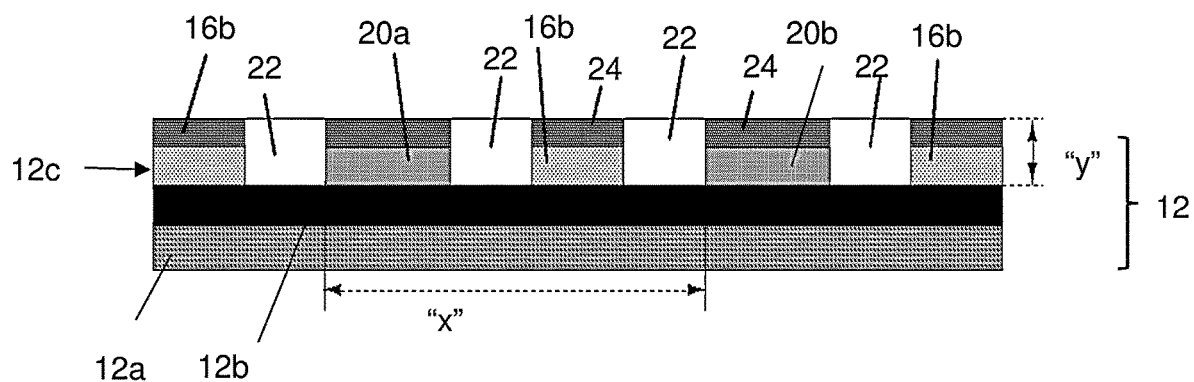
FIG. 5E is a cross-sectional view of FIG. 5A, along line D-DD.

FIG. 5A is a top view of an asymmetrical device 10c with staggered body contacts 20a-20c. FIG. 5B is a cross-sectional view of FIG. 5A, along line A-AA. FIG. 5C is a cross-sectional view of FIG. 5A, along line B-BB. FIG. 5D is a cross-sectional view of FIG. 5A, along line C-CC. FIG. 5E is a cross-sectional view of FIG. 5A, along line D-DD. As shown in the cross-sectional views of FIGS. 5B-5E, the substrate 12 comprises SOI technology, i.e., an insulator layer 12b on top of a semiconductor wafer 12a and a semiconductor layer 12c on top of the insulator layer 12b. In embodiments, the semiconductor layer 12c is implanted with dopants (n+ and p+) to form the staggered body contacts 20a-20c and source/drain regions 16a, 16b, as already described herein.

The gate structure 14 further includes a channel region 14a, a gate dielectric material 14b and a gate body material 14c. As should be understood, the semiconductor layer 12c is a lightly doped substrate which forms the channel region 14a. The staggered body contacts 20a-20c, optionally the end point body contacts 18a, 18b, and source/drain regions 16a, 16b are also separated or isolated from each other by the shallow trench isolation structures 22. The staggered body contacts 20a-20c and source/drain regions 16a, 16b have a depth of "y", which is preferably less than the thickness of the insulator layer 12b and the semiconductor wafer 12a. Moreover, the body contacts 20a-20c and source/drain regions 16a, 16b extend to the underlying insulator layer 12b (e.g., BOX).

As further shown in FIGS. 5B-5E, the staggered body contacts 20a-20c and the source/drain regions 16a, 16b each include silicide contacts 24. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 16a, 16b and respective staggered body contacts 20a-20c). After deposition of the material, the structure is heated allowing the transition metal to react with exposed silicon (or other semiconductor material as described herein) in the active regions of the semiconductor device (e.g., source region 16a, drain region 16b, and staggered body contacts 20a-20c) forming a low-resistance transition metal silicide. Following the reaction, any remaining transition metal is removed by chemical etching, leaving silicide contacts 24 in the active regions of the device.

Figure 6:
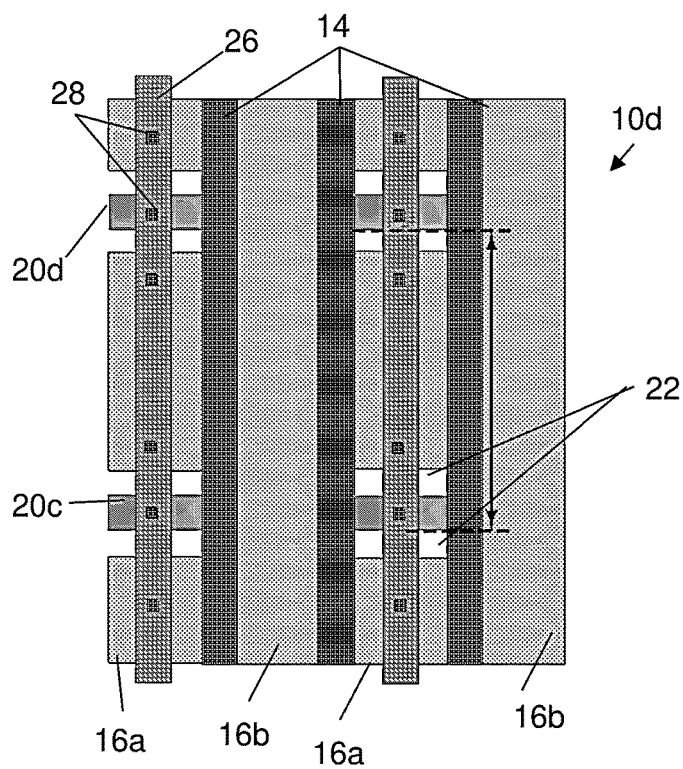
FIG. 6 shows a non-symmetric multi-finger device with body-source shorts, amongst other features, in accordance with aspects of the disclosure.

FIG. 6 shows a non-symmetric multi-finger device with body-source shorts, amongst other features. More specifically, the non-symmetric multi-finger device 10d of FIG. 6 includes multiple gate structures 14, each having body contacts 20c, 20d electrically connected along their source side. Although two body contacts are shown in this and other embodiments, it is understood that more than two body contacts are also contemplated based on parameters described herein. Also, as in each of the multi-finger embodiments, adjacent gate structures 14 can share a drain region 16b and a source region 16a. In this embodiment, a wiring structure 26 is formed over both the body contacts 20c, 20d and the source region 16a of each gate structure 14. The wiring structure 26 includes contacts 28, e.g., via contacts, which electrically connect each source region 16a to the body contacts 20c, 20d. In this way, the body contacts 20c, 20d are shorted to the source region 16a of each gate structure 14.

Figure 7:
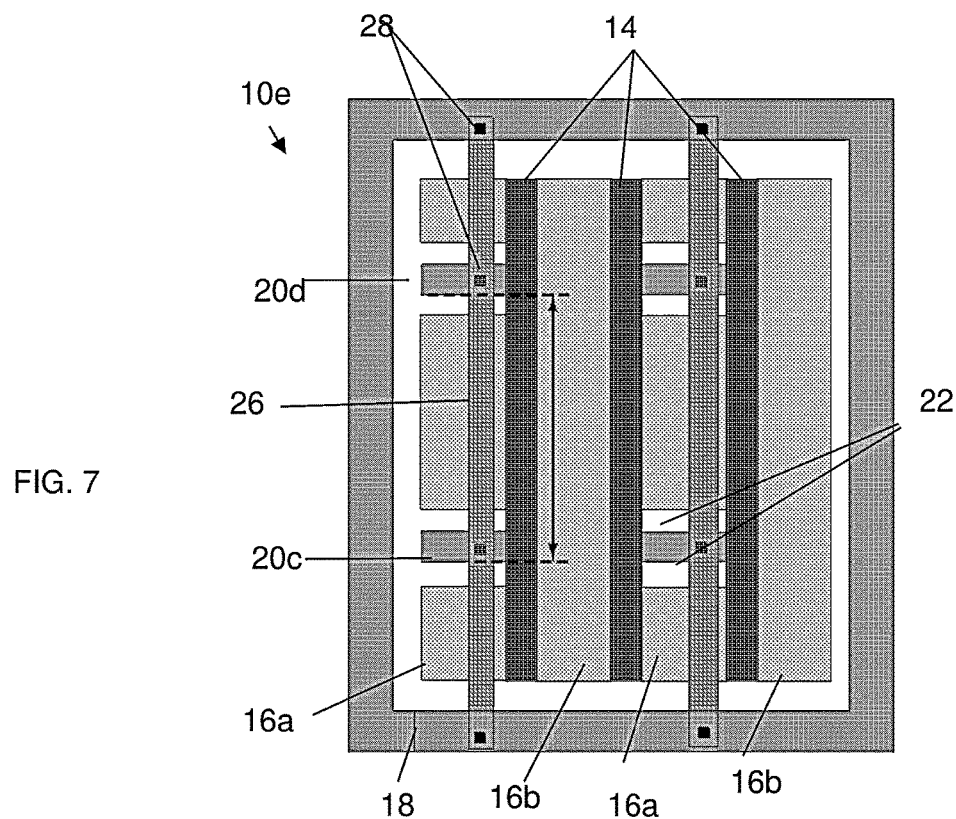
FIG. 7 shows a non-symmetric multi-finger device with separate body terminals, amongst other features, in accordance with aspects of the disclosure.

FIG. 7 shows a non-symmetric multi-finger device with separate body terminals, amongst other features. More specifically, the non-symmetric multi-finger device 10e of FIG. 7 includes multiple gate structures 14, each having body contacts 20c, 20d electrically connected along their source side. In addition, the body ring contact 18 surrounds the non-symmetric multi-finger device 10e, e.g., multiple gate structures 14. In this embodiment, the wiring structure 26 formed over both the body contacts 20c, 20d and the source region 16a of each gate structure 14 includes contacts 28, e.g., via contacts, which electrically connect the body contacts 20c, 20d to the body ring contact 18. In this way, the body contacts 20c, 20d for each gate structure 14 will be electrically connected to a separate body terminal and, hence, can be biased independently.

Figure 8:
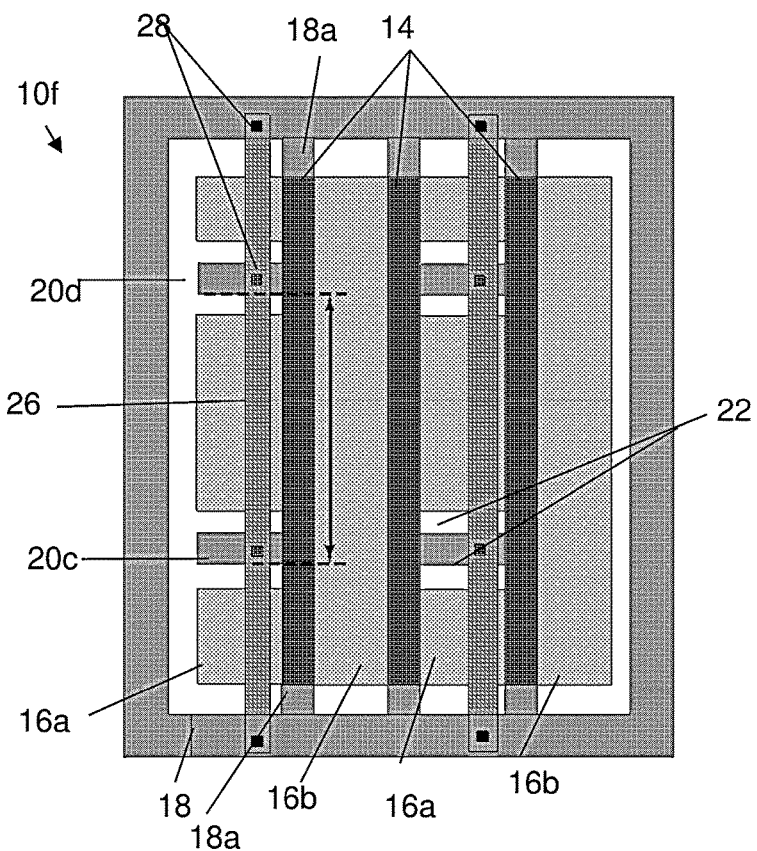
FIG. 8 shows a non-symmetric multi-finger device with separate body terminals and end terminals, amongst other features, in accordance with aspects of the disclosure.

FIG. 8 shows a non-symmetric multi-finger device with separate body terminals and end terminals, amongst other features. In addition to the features shown in FIG. 7, the non-symmetric multi-finger device 10f of FIG. 8 includes the contact bridges 18a, 18b (18a, 18b have same polarity doping as body contacts 20) which electrically connecting each end of a respective gate structure 14 to the body ring contact 18.

Figure 9:
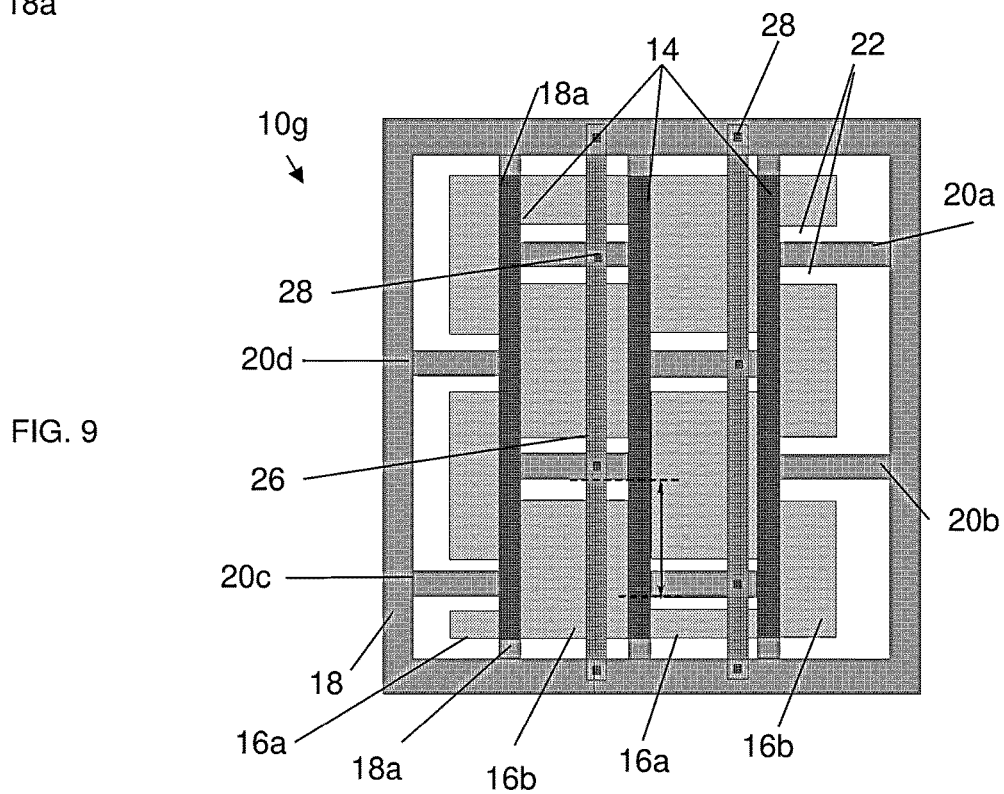
FIG. 9 shows a symmetric multi-finger device with separate body terminals and optional end terminals, amongst other features, in accordance with aspects of the disclosure.

FIG. 9 shows a symmetric multi-finger device with separate body terminals and optional end terminals, amongst other features. In addition to the features shown in FIG. 8, the symmetric multi-finger device 10g of FIG. 9 includes body contacts 20a, 20b along a drain side. In this embodiment, the body ring contact 18 is electrically connecting to each end of each gate structure 14 by the contact bridges 18a, 18b, in addition to the wiring structure 26 electrically connecting the body ring contact 18 to the body contacts 20c, 20d on the source side. More specifically, the body ring contact 18 connects all body contacts on source/drain regions 16a, 16b with wiring structure (e.g., metal) 26. In this and other embodiments, the use of the contact bridges 18a, 18b are optional. The body ring contact 18 is also electrically connected to the gate structures 14 on the drain side by the body contacts 20a, 20b.

Figure 10:
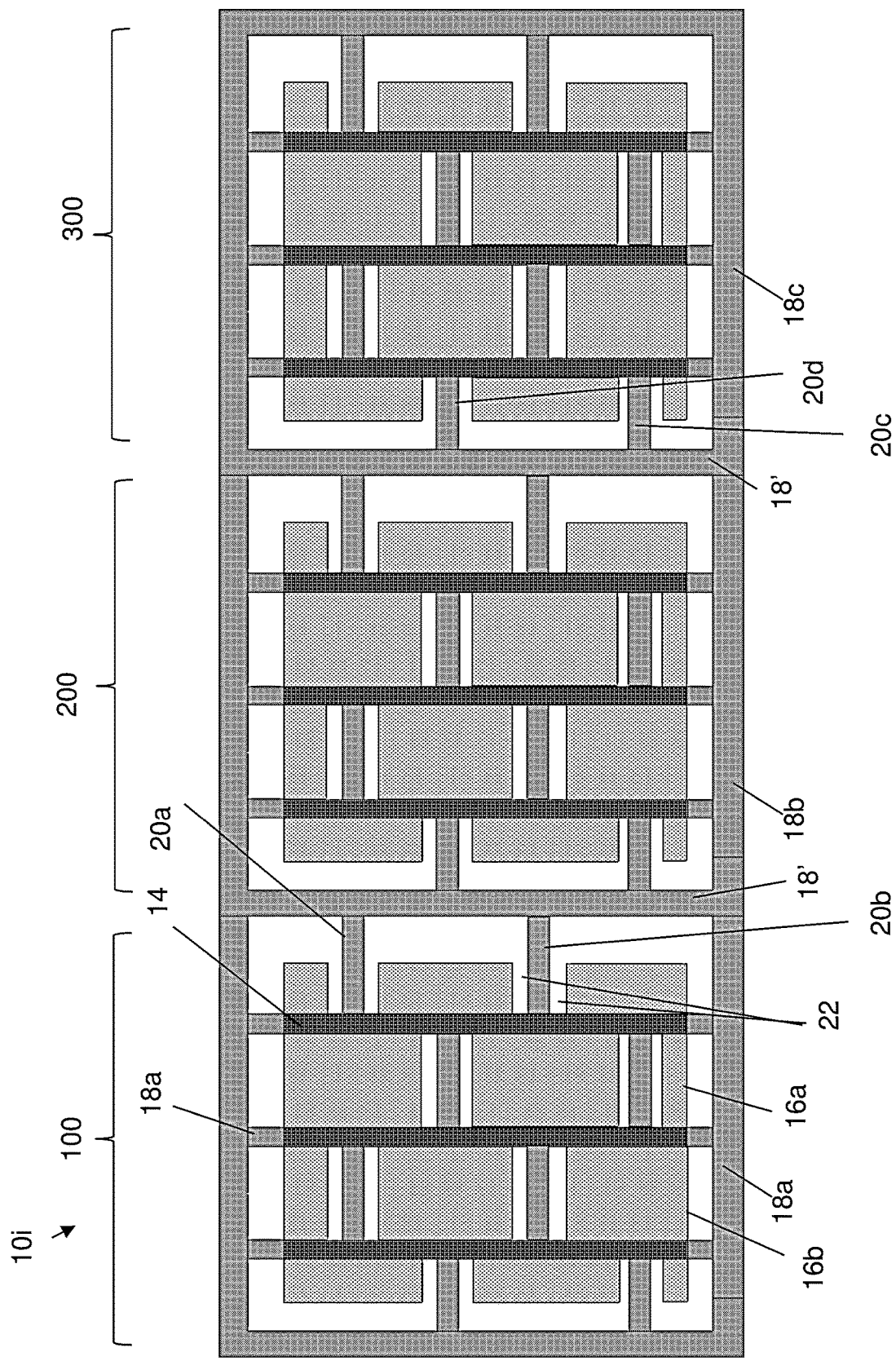
FIG. 10 shows a symmetric multi-finger device with common contacts from a ring body contact, amongst other features, in accordance with aspects of the disclosure.

FIG. 10 shows a symmetric multi-finger device with common contacts from a ring body contact, amongst other features. More specifically, the device 10i shown in FIG. 10 shows three symmetric multi-finger devices in a parallel combination, e.g., to make a total of 9 fingers ($nf_{total}$=9). In this embodiment, each symmetric multi-finger device 100, 200, 300 is connected together by a common leg 18' of each ring contact structure 18a, 18b, 18c. In addition, each common leg 18' is connecting to the body contact 20c, 20d on a source side and 20a, 20b on a drain side of adjacent gate structures 14 of adjacent symmetric multi-finger device 100, 200, 300. It should be recognized that any number of symmetric multi-finger devices in a parallel combination are also contemplated herein, and that the use of three symmetric multi-finger devices are provided as a non-limiting, illustrative example. In this example metal wire 26 is not needed to electrically connect all the body contacts to the body contact ring 18.

Figure 11:
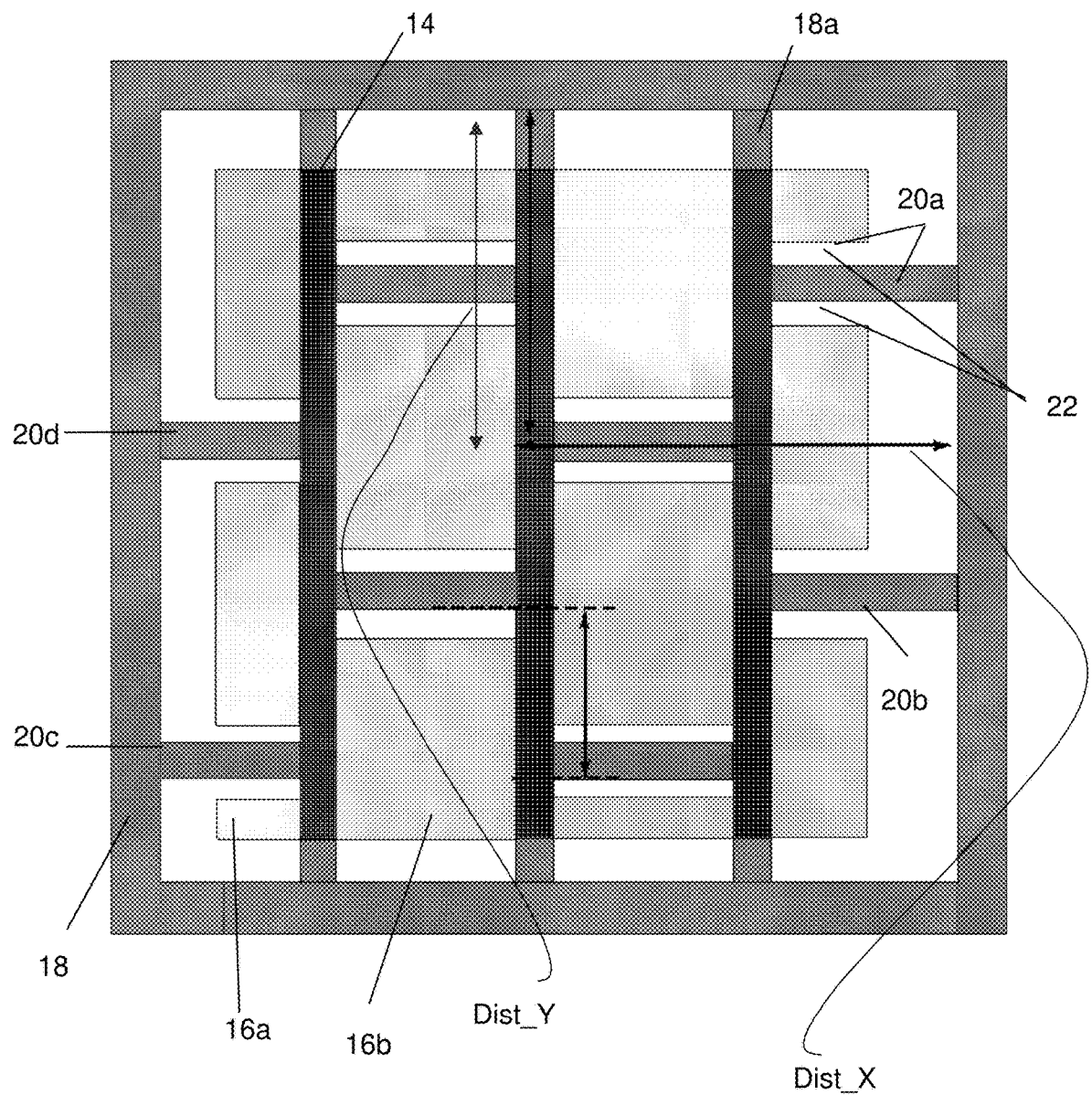
FIG. 11 graphically shows a maximum number of gate structures which can be used inside a contact ring body in accordance with aspects of the disclosure.

FIG. 11 graphically shows a maximum number of gate structures 14 which can be used inside a contact ring body 18, without using metal wire 26 to connect the body contacts. To determine the maximum number of fingers ($nf_{unit}$) in each unit, the following equation should be satisfied:

$$\text{Max}(\text{dist\_}X) \leq \text{dist\_}Y,$$

In this equation, dist_X and dist_Y are the distances of the contact ring body 18 from a midpoint of the entire unit. After this is calculated, multiple units can be placed in parallel to create the device with $nf_{total}$, where $nf_{total} = nf_{unit} \times \text{number\_of\_units}$.

Figure 12A:
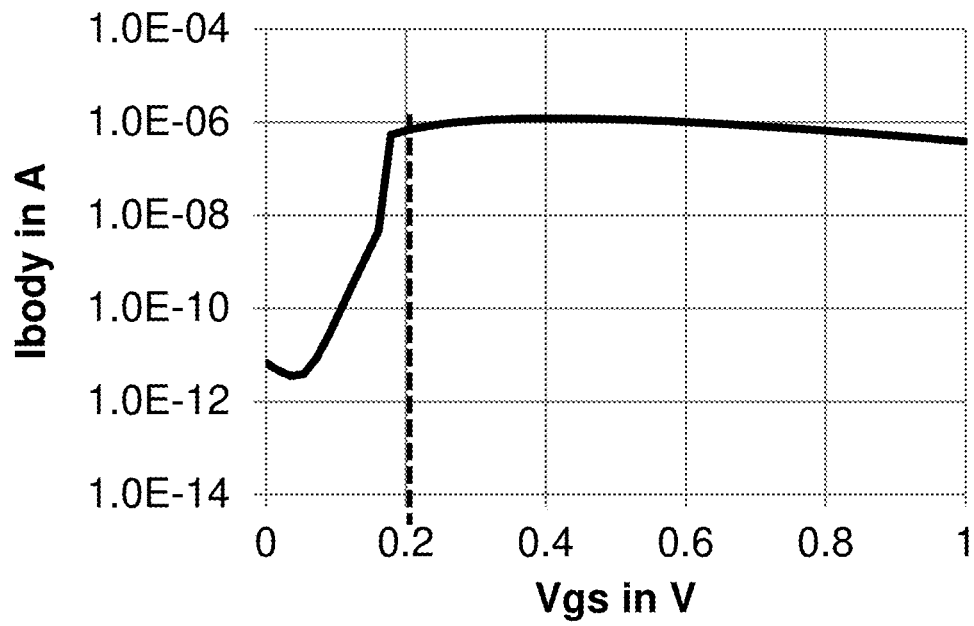
FIGS. 12A-12C show several graphs used to determine an optimum pitch, e.g., distance "x", for the body contacts in accordance with aspects of the disclosure.
Figure 12B:
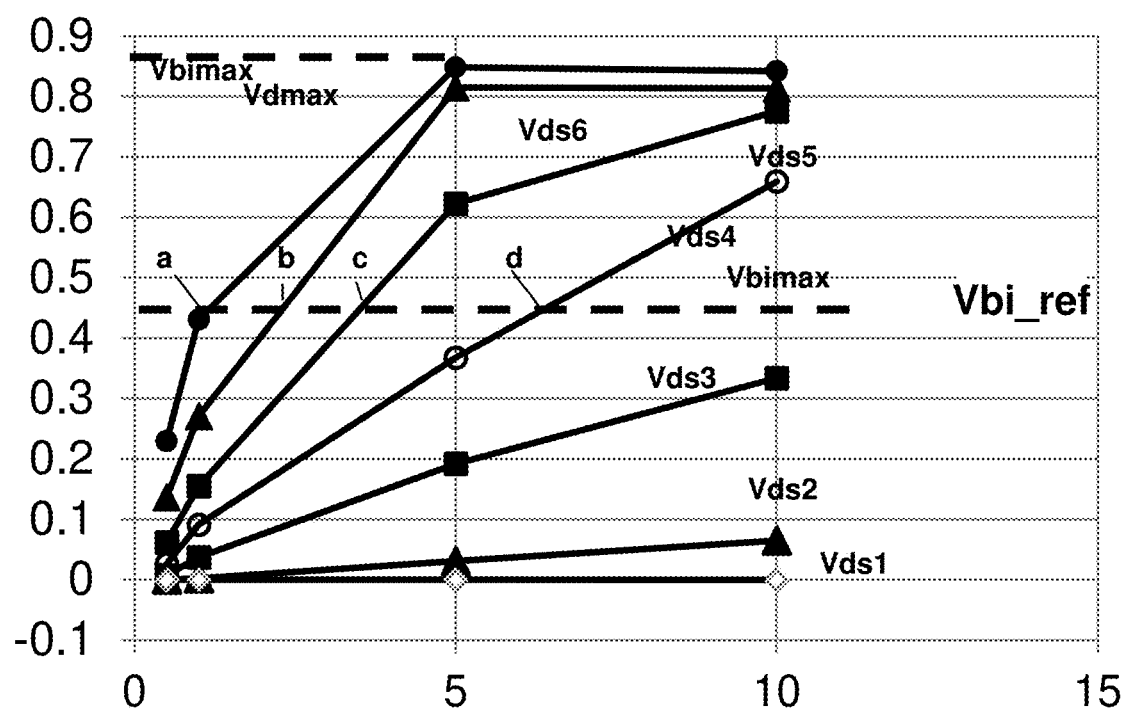
Figure 12C:
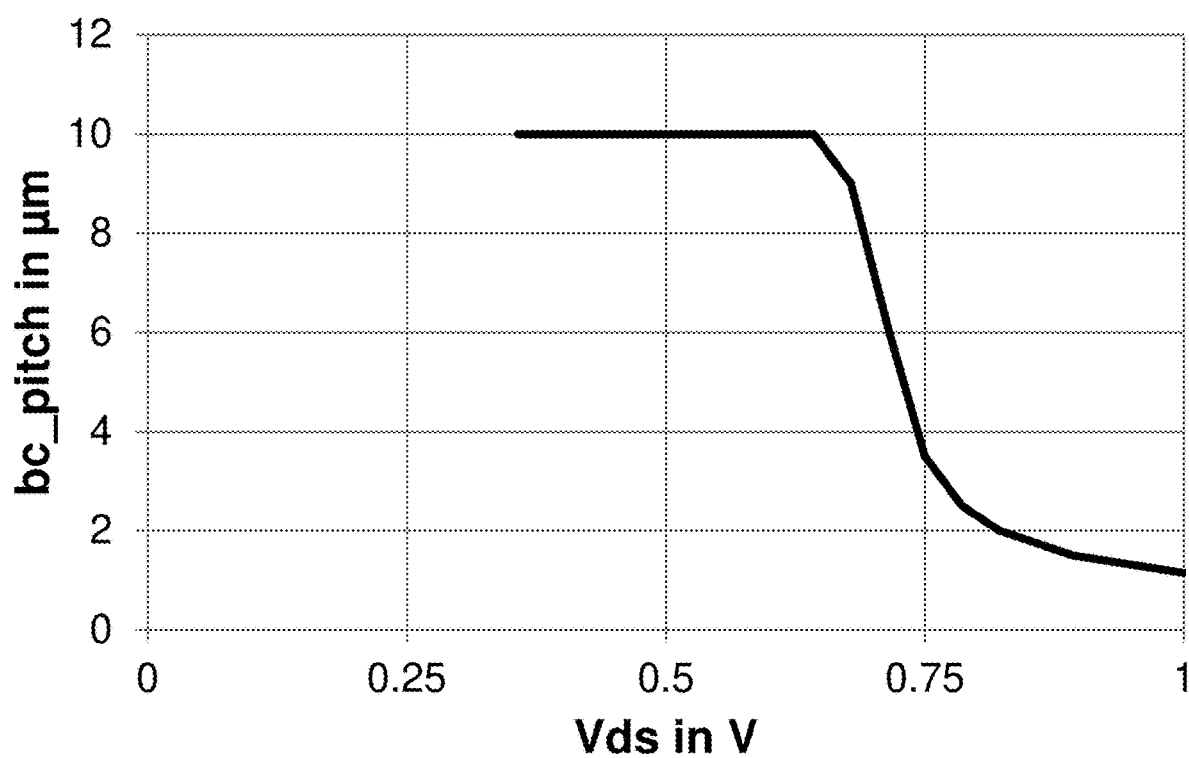

FIGS. 12A-12C show several graphs used to determine an optimum pitch, e.g., distance "x", for the body contacts. FIG. 12A shows Vgs (gate-source voltage) on the "x" axis and body current in amps on the y-axis. FIG. 12B distance from body contact edge in μm on the x-axis and internal body potential (Vbi) in V on the y-axis. FIG. 12C shows Vds on the x-axis and body contact pitch in μm on the y-axis. FIG. 12C provides the optimum value of the bc_pitch (e.g., distance "x") at a given Vds.

Referring to the graphs of FIGS. 12A-12C, the following processes can be used to find the optimal distance "x":

1. Measure the body current (Ibody) vs Vgs at Vds=maximum Vds (denoted by Vdmax in FIG. 12B).

2. Determine Vgs=Vgmax, at which Ibody is maximum (dashed line in FIG. 12A). Note that Vgs along the x-axis in FIG. 12A is normalized with respect to Vdmax.

3. At Vgs=Vgmax, measure the internal body potential (Vbi) distribution along the width of the device (i.e., at variable distance from the body contact end of the device) for different Vds values (e.g., Vds1 . . . . Vdmax in FIG. 12B)

4. Assume a reference Vbi (Vbi_ref) is equal to half of the maximum Vbi at Vdmax. (Vbimax in FIG. 12B).

5. Draw a horizontal line with a constant Vbi=Vbi_ref, and collect all the intersection points (a, b, c . . . in FIG. 12B) of this Vbi=Vbi_ref line with different constant Vds lines.

6. Plot the intersection points (collected in step 5) as shown in FIG. 12C, where the x-axis is Vds and the y-axis is the X coordinates of the intersection points (a, b, c . . . ) in FIG. 12B. For example coordinate of an intersection point in FIG. 12B (X1, Vds1) is transformed as the coordinate of the same point (Vds1,X1) in FIG. 12C.

7. Determine the optimum value of the bc_pitch (e.g., distance "x") at a given Vds in FIG. 12C.

8. Once the bc_pitch value is determined from FIG. 12C, consecutive body contacts can be placed at 2×bc_pitch distance (e.g., distance "x"). Vds along the x-axis in FIG. 12C is normalized with respect to Vdmax.

Figure 13:
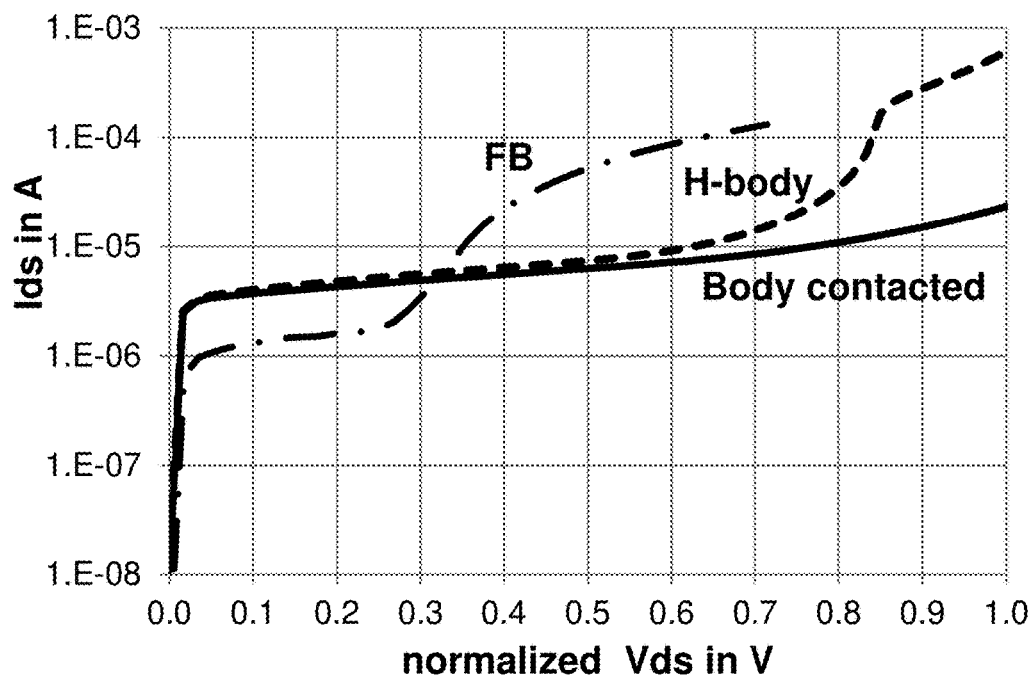
FIG. 13 is a comparison graph showing the Ids linearity of a device which incorporates the body contacts in accordance with aspects of the disclosure.
Figure 14:
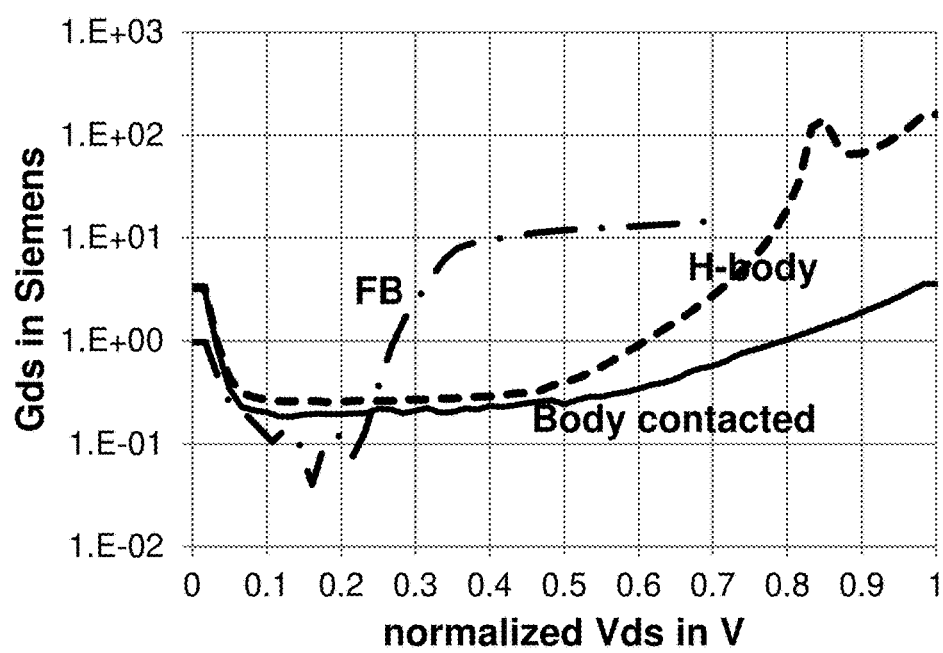
FIG. 14 is a comparison graph showing the Gds linearity of a device which incorporates the body contacts in accordance with aspects of the disclosure.

FIGS. 13 and 14 are comparison graphs showing the Ids linearity and Gds linearity, respectively, of a device which incorporates the body contacts in accordance with aspects of the disclosure. In FIGS. 13 and 14, the x-axis is a normalized Vds in volts (V) (e.g., normalized to maximum Vds (Vdmax)); whereas, in FIG. 13 the y-axis is Ids in amps (A) and, in FIG. 14 the y-axis is Gds in Siemens. Also, both FIGS. 13 and 14 make a comparison of a floating body device, an H-body device and a device which incorporates the body contacts as described herein. In these measurements, the source, the body and the gate are kept at fixed voltage and the drain bias is swept linearly. As shown, in FIGS. 13 and 14, the device which incorporates the body contacts shows the most linear Ids and Gds, respectively.

Figure 15:
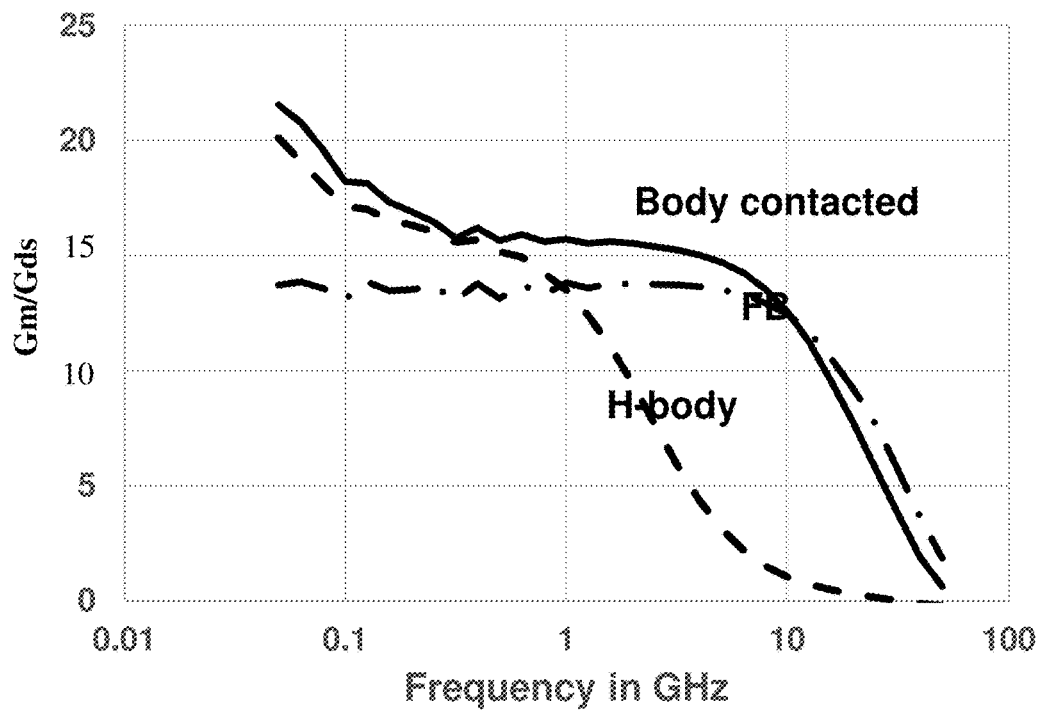
FIG. 15 is a comparison graph showing a maximum self-gain of a device which incorporates the body contacts in accordance with aspects of the disclosure.

FIG. 15 is a comparison graph showing a maximum self-gain (i.e., s-parameter data) of a device which incorporates the body contacts in accordance with aspects of the disclosure. In the graph of FIG. 15, the x-axis is frequency (GHz) and the y-axis is Gm/Gds. Compared to the floating body device and the H-body device, the device which incorporates the body contacts is shown to have a maximum self-gain.

Figure 16:
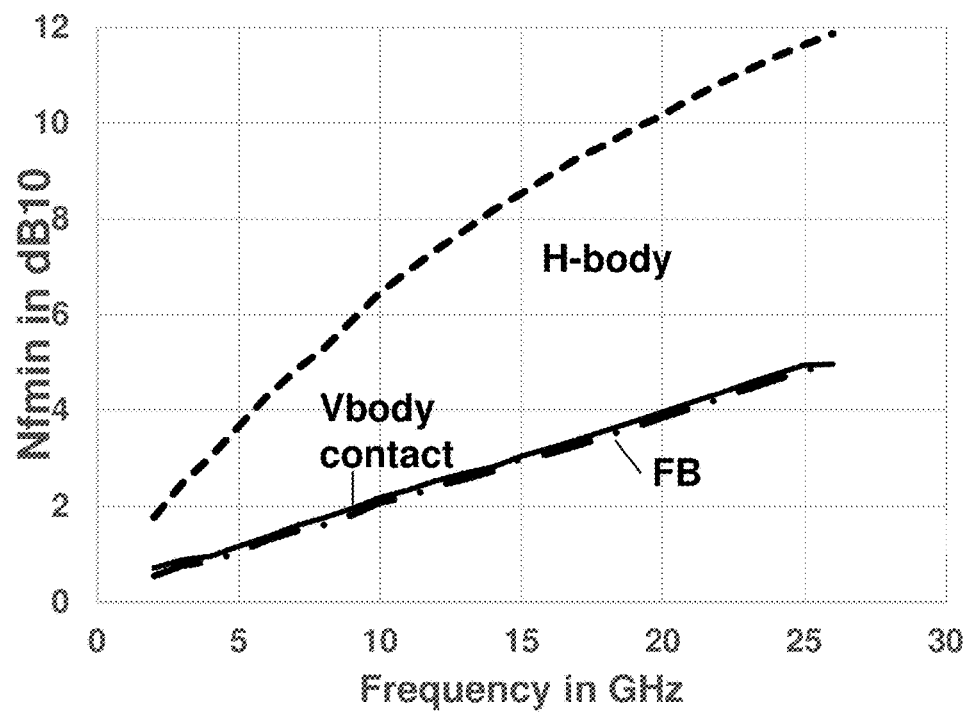
FIG. 16 is a comparison graph showing a minimum noise of a device which incorporates the body contacts in accordance with aspects of the disclosure.

FIG. 16 is a comparison graph showing a minimum noise of a device which incorporates the body contacts in accordance with aspects of the disclosure. In the graph of FIG. 16, the x-axis is frequency (GHz) and the y-axis is minimum noise (Nfmin(in dB10 unit)). Compared to the floating body device and the H-body device, the device which incorporates the body contacts is shown to have a minimum noise figure.

Figure 17:
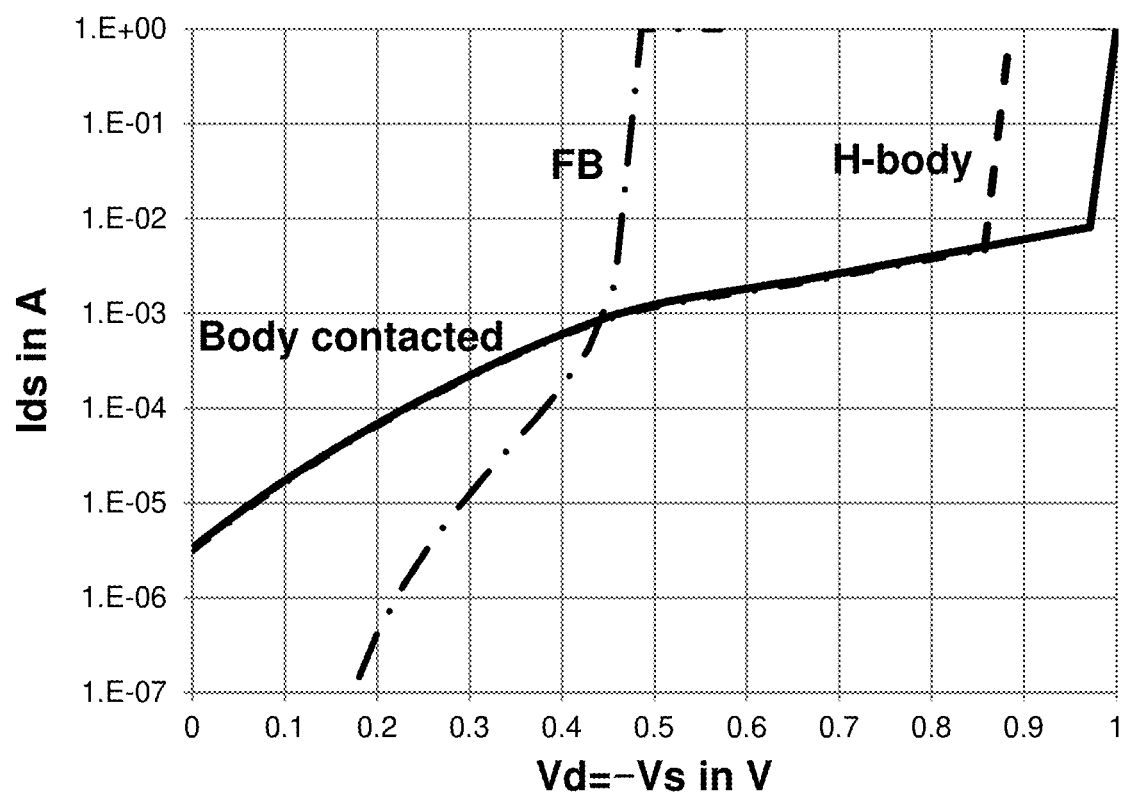
FIG. 17 is a comparison graph showing a maximum off state breakdown voltage of a device which incorporates the body contacts in accordance with aspects of the disclosure.

FIG. 17 is a comparison graph showing a maximum breakdown voltage of a device which incorporates the body contacts in accordance with aspects of the disclosure in off condition (i.e. when the Vgs<0). In the graph of FIG. 17, the x-axis is Vd (V) (e.g., normalized to maximum Vds) and the y-axis is Ids (A). Moreover, in this graph, the drain and source terminal are synchronously swept with reverse polarity, and the breakdown voltage (BV) is defined as Vds voltage, at which a drain current jumps abruptly. In comparison to the floating body device and the H-body device, the device with the body contacts has a maximum off state breakdown voltage.

The devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a plurality of body contacts electrically contacting a channel region under a gate body and which are configured to be biased independently, and isolation structures extending to an insulator layer under the gate body and which isolates the plurality of body contacts from a source region and a drain region adjacent to the gate body and the plurality of body contacts surround the gate body and the source region and the drain region.

2. The structure of claim 1, wherein the gate body is part of a gate structure on a semiconductor substrate material.

3. The structure of claim 2, wherein the isolation structures isolate the plurality of body contacts from the source region and the drain region associated with the gate structure.

4. The structure of claim 2, wherein the plurality of body contacts are electrically contacting the gate body on a same side of as a source region of the gate structure.

5. The structure of claim 2, wherein the plurality of body contacts are electrically contacting the gate body on a same side as a source region and a same side as a drain region, and the body contacts on the same side as the source region are electrically contacting a ring body contact by a wiring structure and the body contacts on the same side as the drain region are directly electrically contacting the ring body contact.

6. The structure of claim 2, further comprising a contact ring body which surrounds the gate structure and which electrically contacts to each of the plurality of body contacts and comprises a P+ dopant type for an nMOSFET and an N+ dopant for a pMOSFET.

7. The structure of claim 6, further comprising contact bridges electrically contacting the channel region under gate body along both ends and the contact ring body.

8. The structure of claim 1, wherein the plurality of body contacts overlap underneath the gate body along a width of the gate body.

9. The structure of claim 1, wherein the gate body includes at least one notch or tab portion which extends laterally outward from the at least one side of the gate body, and each of which electrically connects to a respective body contact of the plurality of body contacts.

10. The structure of claim 1, wherein the plurality of body contacts are staggered about the gate body along both sides along a width.

11. The structure of claim 1, wherein the plurality of body contacts are symmetrically placed about the gate body.

12. The structure of claim 1, wherein the plurality of body contacts are asymmetrically placed about the gate body.

13. The structure of claim 1, further comprising a wiring structure formed over the plurality of body contacts and the source region and electrically connecting each source region to the body contacts.

14. A structure comprising:
   a plurality of gate structures on a semiconductor on insulator substrate;
   a source region and a drain region on opposing sides of the plurality of gate structures;
   a plurality of body contacts electrically contacting the plurality of gate structures; and
   isolation structures extending to the insulator layer and isolating the plurality of body contacts from the source region and the drain region,
   wherein the plurality of gate structures comprises a multi-finger gate structure which each adjacent gate structures sharing the drain region or the source region.

15. The structure of claim 14, further comprising an insulator layer underlying the semiconductor on insulator substrate and the source region and the drain region extend to the insulator layer.

16. The structure of claim 14, wherein the plurality of body contacts are offset from each other by a minimum distance of 2*body contact (bc) pitch.

17. The structure of claim 14, wherein the plurality of gate structures is three or more gate structures with shared source regions, and the plurality of body contacts electrically contacting the gate structures are shared along the shared source regions.

18. The structure of claim 17, wherein the plurality of body contacts are staggered about the least one gate structure along both sides along its width.

19. The structure of claim 14, wherein the plurality of body contacts are configured to be biased independently.

20. The structure of claim 14, further comprising a wiring structure formed over the plurality of body contacts and the source region of each gate structure, the wiring structure includes contacts electrically connecting each source region to the body contacts such that the body contacts are shorted to the source region of each gate structure of the plurality of gate structures.

* * * * *